United States Patent [19]

Stefanowski

[11] Patent Number: 5,281,281
[45] Date of Patent: Jan. 25, 1994

[54] NO-CLEAN, LOW-RESIDUE, VOLATILE ORGANIC COMPOUND FREE SOLDERING FLUX AND METHOD OF USE

[75] Inventor: Krystyna Stefanowski, Chicago, Ill.

[73] Assignee: Litton Systems, Inc., Des Plaines, Ill.

[21] Appl. No.: 14,203

[22] Filed: Feb. 5, 1993

[51] Int. Cl.$^5$ .............................................. B23K 35/34
[52] U.S. Cl. ....................................... 148/23; 148/24; 148/25
[58] Field of Search ..................................... 148/23-25

[56] References Cited

U.S. PATENT DOCUMENTS

| | | | |
|---|---|---|---|
| 3,424,625 | 1/1969 | Tlegel | 148/23 |
| 4,478,650 | 10/1984 | Zado | 148/23 |
| 4,601,763 | 7/1986 | Stratil et al. | 148/23 |
| 4,708,751 | 11/1987 | Froebel | 148/23 |
| 5,085,365 | 2/1992 | Turner | 148/23 |

*Primary Examiner*—Peter D. Rosenberg
*Attorney, Agent, or Firm*—Michael H. Wallach

[57] ABSTRACT

A no-clean, low-residue, rosin-free soldering flux is described which comprises a solvent consisting essentially of demineralized water present in amount of at least about 95% by weight based on total weight of the soldering flux; from about 1% to about 4% by weight based on total weight of the soldering flux of a fluxing agent consisting essentially of at least two carboxylic acids selected from the group consisting of $C_2$-$C_{10}$ dicarboxylic acids, monocarboxylic acids and hydroxy acids, said fluxing agent being present as solute in said deionized water solvent; and nonionic surfactant present in an amount of less than about 1% by weight based on total weight of soldering flux.

11 Claims, No Drawings

NO-CLEAN, LOW-RESIDUE, VOLATILE ORGANIC COMPOUND FREE SOLDERING FLUX AND METHOD OF USE

FIELD OF THE INVENTION

The invention relates to no-clean (low-residue) soldering fluxes.

BACKGROUND OF THE INVENTION

Fluxes comprised of dicarboxylic acids as fluxing agents are described in the seminal U.S. patent of Ernest G. Tiegel, U.S. Pat. No. 3,424,625. Solutions comprising a major portion of dicarboxylic acids dissolved in a minor portion of organic solvents such as lower alcohols, ethers, aldehydes, ketones and dimethyl sulfoxide are described in the Tiegel patent.

U.S. Pat. No. 4,708,751 discloses low levels of dicarboxylic acids (less than 3.5%) dissolved in organic solvents and other ingredients including low levels of rosin (less than 2%).

Halogen-free fluxes which are also rosin-free utilizing organic acid based fluxing agents are also described in the art.

U.S. Pat. No. 4,601,763 describes rosin-free and halogen-free fluxes containing low levels of dicarboxylic acids (3%) dissolved in organic solvents(s).

In U.S. Pat. No. 5,085,365 the environmental problem with using cholorfluorocarbon (CFC) solvents to remove rosin flux residue is addressed. CFC solvents evaporate into the atmosphere and cause the depletion of the protective ozone layer in the stratosphere. U.S. Pat. No. 5,085,365 describes the use of polycarboxylic acids such as citric acid as fluxing agents. Where the fluxes of U.S. Pat. No. 5,085,365 are used, rinsing is required—and thereafter, the rinse water needs to be processed because it is necessary to remove acid flux residue therefrom.

Another alternative to using rosin fluxes and cleaning with environmentally detrimental solvents is to use fluxes with a low solids content (less than 6%) as described in U.S. Pat. No. 4,708,751, where low levels of fluxing agent, namely, less than about 3.5% are described. The flux described in U.S. Pat. No. 4,708,751 is known in the electronics industry as a no-clean, low-residue or low-solids flux. No rinsing is required for this type of flux.

The current and developing problem with low-residue fluxes of all types is that such fluxes are based on alcohol and/or other volatile organic compound solvents. Such fluxes are applied to the bottom of a printed circuit assembly by pumping the flux into a wave, spraying or passing air into the flux to create a foam head and then conveying the printed circuit assembly over the flux. The next step in the process is to convey the assembly over or through a preheater to evaporate away the volatile solvent and activate the flux. Then the assembly is conveyed across a melted solder wave or pot. This rapid evaporation of the volatile solvent permits high speed conveying and soldering without spattering when the assembly touches the melted solder.

Volatile Organic Compounds (VOCS) have been described in the Federal Register (Vol.55, No.126 Friday, Jun. 29, 1990) Rules and Regulations as "any organic compound which participates in atmospheric photo-chemical reactions." Already the State of California has recognized that VOCs emitted into the lower atmosphere contribute to the formation of smog by photochemical reaction and requires record keeping of VOC emissions.

Fluxes in use by the electronics industry for mechanized soldering of printed circuit assemblies either contain undesirable VOCs or, if water-based, contain conductive and/or undesirable levels of corrosive organic acids which must be removed with water after fluxing.

The present invention provides a VOC-Free, no-clean, low-residue flux using a demineralized water-based solvent system.

SUMMARY OF THE INVENTION

It is an objective of the present invention to provide suitable fluxes for mechanized soldering of electronic assemblies. The fluxes contain no volatile organic compound solvents.

It is a further objective of the present invention to provide fluxes which when applied by wave, foaming or spraying, achieve high quality soldering and leave a low residual level of non-corrosive, non-conductive fluxing agent which does not require removal after soldering.

The fluxes of the present invention accomplish the foregoing objectives by use of VOC-free formulas consisting essentially of a plurality of active fluxing agents and one or more nonionic surfactants that are dissolved in demineralized water. Demineralized water is water treated by demineralization to remove minerals usually present in ionized form, typically by ion-exchange, distillation, or dialysis. Demineralized water obtained by ion-exchange is referred to herein as deionized water. The active fluxing agents are present at levels of about 1% to about 4% by weight. Preferably the total amounts of active fluxing agent is present in amount of from about 1% to about 3% by weight. The active fluxing agent component in the flux of the present invention is comprised of at least two fluxing agents that are selected from mixtures of (1) saturated and/or unsaturated dicarboxylic acids containing two to ten carbons; (2) one or more of the previously described dicarboxylic acids in combination with one or more monocarboxylic acid(s) and/or hydroxy acids(s); and (3) combinations of monocarboxylic acids, combinations of hydroxy acids, preferably mono-or dicarboxylic hydroxy acids, or combinations of monocarboxylic and hydroxy acids.

DETAILED DESCRIPTION OF THE INVENTION

In accordance with the present invention, the flux solvent consists essentially of demineralized water. The fluxing agent is dissolved in the demineralized water. Suitable fluxing agents are mono- and/or dicarboxylic acids and/or hydroxy acids. One or more nonionic surfactants are also present in the flux. The total solids content of the flux is less than about 5% by weight, with at least about 1% fluxing agent being required. Fluxing agent content in the range of from at least about 1% to about 4% by weight achieves the dual objectives of satisfactory fluxing without the need to clean the soldered area after application of solder. It has been observed that in the flux formulations of the present invention, fluxing is enhanced my using a plurality of fluxing agents.

The combination of acids provides an expanded melting range at the elevated soldering temperature levels where the deionized water solvent is evaporated and also provides enhanced wetting. The combination of acids includes combinations of elevated/high melting point acids such as succinic and adipic acids and/or combinations of high melting acids mixed with smaller quantities of lower melting acids such as glutaric acid. Combining acids achieves broadening of the fluxing agent melting range which falls within the range delimited by the solder melting point (solidus point) and the upper soldering temperatures; that is a temperature range typically from about 180° C. to about 260° C. The combination of acids also enhances precleaning during preheating. It has been observed that there is an expanded window of flux activity when the melting range is increased.

Examples of acids among those suitable as fluxing agents in the soldering flux of the present invention are:

| dicarboxylic acids: | oxalic, adipic, succinic, malonic, maleic, glutaric, pimelic, suberic, azelaic, and sebacic acids. |
|---|---|
| hydroxy acids: | malic, tartaric, citric, lactic, mandelic, glyceric, and glycolic acids |
| monocarboxylic acids: | valeric, caproic, phenylacetic, benzoic, salicylic, and aminobenzoic acids |

The presence of a nonionic surfactant is essential to the present invention.

In the present invention where demineralized water without other cosolvents is used, surfactant is necessary to achieve acceptable levels of flux wet out or spread on the metal surface. Water has a high surface tension and the nonionic surfactant lowers the surface tension. Surfactants that act as foaming agents find added utility as additives for foam flux formation. The formula selected cannot foam too much or the foam head will be too stable to allow the flux bubbles to pop on the surface being fluxed and soldered. In the flux compositions of the present invention, the surfactant which is nonionic also provides the added and important attribute of enhancing the heat stability of the flux. Added heat stability impedes boil-away during soldering, which at the low flux agent content required by the present invention must be arrested/ameliorated.

Examples of nonionic surfactants that are suitable for use in the soldering fluxes of the present invention are: phenoxypolyethoxy ethanols; perfluoralkyl alcohols; glycol fatty acid esters such as glycerol monolaurate, and/or ethylene glycol distearate, alkylaryl polyether alcohols; tertiary acetylenic glycols; ethoxylated polyoxypropylenes; and alkoxylated phenols such as alkoxylated bisphenols. One or more nonionic surfactants may be used.

Soldering fluxes of the present invention are illustrated by reference the non-limiting examples which follow below.

EXAMPLE 1

| adipic acid | 1.5 weight % |
|---|---|
| succinic acid | 0.5 weight % |
| octylphenoxypolyethoxy ethanol | 0.1 weight % |
| deionized water | 97.9 weight % |

This composition when used as a spray or wave flux exhibits excellent soldering with resulting minimal residue and corrosion.

EXAMPLE 2

| adipic acid | 1.5 weight % |
|---|---|
| glutaric acid | 0.3 weight % |
| glyceric acid | 0.2 weight % |
| perfluoroalkyl ethanol | 0.1 weight % |
| deionized water | 97.9 weight % |

This composition exhibits good properties as a foam flux.

EXAMPLE 3

| pimelic acid | 1.0 weight % |
|---|---|
| azelaic acid | 0.3 weight % |
| phenylacetic acid | 0.1 weight % |
| phenoxypolyethoxy ethanol | 0.8 weight % |
| deionized water | 97.8 weight % |

This composition exhibited an excessive degree of foaming when used as a foam flux; however, the flux provided excellent solder filling of plated through holes in a printed circuit board.

EXAMPLE 4

A series of experiments were conducted using the flux formulations of the present invention to evaluate the performance under production conditions. The equipment used for testing was an automatic wave soldering machine (Electrovert Mini-Pac) consisting of a foam fluxing station, preheater and wave solder pot, all inline and over which a conveyor carries printed circuit board assemblies. The printed circuit board was mounted into a dual rail fixture which was placed onto the conveyor.

For this testing, a variety of printed circuit boards were used either to produce samples for further testing of the electrical properties of the flux residue or to evaluate the ideal machine control parameters for producing acceptable soldering. Printed circuit boards were the standard IPC (Institute for Interconnecting and Packaging Electronic Circuits) B-25 which contains plated through copper holes and comb patterns for insulation resistance testing. Also used were a variety of printed circuit boards with solder plating either unfused or fused as well as bare copper boards, all double-sided with plated through holes.

After the circuit boards were placed in the fixture and on the conveyor, they traveled at a speed of 5 feet per minute across a wave of flux foam created by passing air into an aerating stone in the foam fluxing unit. It was found helpful to use a low volume air knife after the application of the flux to blow off any extra dripping flux, but this is not always necessary, depending on the action of the particular machine. Alternatively, the flux was applied by spraying to achieve a uniform coating on the circuit board surface.

An observation of the flux composition of the invention during the eight hours of foaming established that both the specific gravity and acid number were little changed because of the aeration. The following measurements underscore the advantages of the flux of the present invention over its alcohol-based counterpart.

| Test Parameter | Water-based Flux | Alcohol-based Flux |
|---|---|---|
| Specific gravity @ 25° C. | | |
| Initial | 1.010 | 0.813 |
| 1-hour | 1.010 | 0.824 |
| 2-hours | 1.010 | 0.829 |
| 3-hours | 1.016 | 0.832 |
| 4-hours | 1.015 | 0.833 |
| 5-hours | 1.015 | 0.836 |
| 6-hours | 1.014 | 0.837 |
| 7-hours | 1.014 | 0.839 |
| 8-hours | 1.015 | 0.840 |
| Increase | 0.005 | 0.027 |
| Acid Number g KOH/Kg flux | | |
| Initial | 21.19 | 13.89 |
| 1-hour | 21.19 | 14.99 |
| 2-hours | 21.23 | 16.34 |
| 3-hours | 21.23 | 16.76 |
| 4-hours | 21.60 | 18.62 |
| 5-hours | 21.63 | 19.14 |
| 6-hours | 21.59 | 19.86 |
| 7-hours | 22.09 | 20.34 |
| 8-hours | 21.81 | 21.18 |
| Increase | 0.62 | 7.29 |

The specific gravity is a direct indication of the rapid loss of the alcohol solvent as it evaporates into the atmosphere. This evaporation loss necessitates constant monitoring of the flux to replace the alcohol. The other measure of flux composition control is the acid number which is determined by titration and reported as grams of potassium hydroxide per liter of flux. As the solvent portion of the flux evaporates, the solids or active portion will increase accordingly.

It can readily be seen from the test data that the constant checking of flux composition required of the conventional alcohol-based fluxes is eliminated by using the water-based flux of the present invention.

After application of the flux to the bottomside of the printed circuit board, the conveyor carried the board across the preheater. In the case of these tests, the preheater was a hotplate controlled at 370° C. The reason for this maximum temperature is the possibility of fire when using alcohol-based fluxes which can autoignite at 390° C. Another advantage of the water-based flux is the lack of flammability and the resulting increase in safety.

After numerous trials, the optimum preheat temperature measured on the topside of the printed circuit board was determined to be 105° C.–120° C. this allowed for nearly complete evaporation of the water solvent and minimized spattering when the printed circuit board contacted the solder wave. The topside measurement was equivalent to a bottomside temperature on the 1. 6 mm thick epoxy-glass circuit boards of 145° C.–160° C., the ideal activating temperature of the flux which removes oxidation from the copper and/or tin-lead surfaces on the component leads and printed circuits.

After preparation by the flux across the preheater, the printed circuit board assembly was conveyed across the solder wave. The solder wave temperature for these tests was varied from 235° C. up to 260° C. with equally good soldering results with a variety of flux compositions of the present invention.

After soldering and cooling the test boards, visual examination revealed little or no visible flux residue, a property particularly desired for applications using test probes to evaluate electrical continuity. Additionally, certain soldered boards were tested to evaluate the effect of the flux residue on the insulation resistance properties of the circuit board. For this test, the "B" pattern (0.32-mm lines and spaces) of the IPC-B-25 comb pattern boards was used. After aging at 85° C. and 85% relative humidity for 7 days at a constant bias of 50-volts, readings were taken at an applied 100-volts for one minute. The results in every case using the flux of the invention exceeded $1.6 \times 10^{11}$ ohms, considerably higher than the electronics industry acceptable value of $5.0 \times 10^8$ ohms.

The soldering tests reveal that excellent soldering can be accomplished with the flux of the present invention. The amount of residue remaining is minimal and does not affect automated probe electrical testing or the surface insulation resistance of electronic circuit board assemblies.

It will thus be seen that the objects set forth above, among those made apparent from the preceding description, are efficiently attained, and, since certain changes may be made in the above flux compositions without departing from the spirit and scope of the invention, it is intended that all matter contained in the above description shall be interpreted as illustrative and not in a limiting sense.

I claim:

1. A no-clean, low-residue, rosin-free soldering flux solution consisting essentially of:
   a. demineralized water present in an amount of at least about 95% by weight based on total weight of the soldering flux solution;
   b. from about 1% to about 4% by weight based on total weight of the soldering flux solution of a mixture of fluxing agents composed of at least two carboxylic acid fluxing agents selected from the group consisting of $C_2$–$C_{10}$ dicarboxylic acids, monocarboxylic acids and hydroxy acids, said carboxylic acid fluxing agents being present as solute in said deionized water solvent; and
   nonionic surfactant, said nonionic surfactant being present in an amount of less than about 1% by weight based on total weight of soldering flux solution.

2. The soldering flux of claim 1, wherein the surfactant is present in an amount less than about 0.5% by weight.

3. The soldering flux of claim 1, wherein the content of carboxylic acid fluxing agents is from about 2% to about 3% by weight based on total weight of soldering flux solution.

4. The soldering flux of claim 2, wherein the content of carboxylic acid fluxing agents is from about 2% to about 3% by weight based on total weight of soldering flux solution.

5. The soldering flux of claim 1, wherein the carboxylic acid fluxing agents are a plurality of $C_2$–$C_{10}$ dicarboxylic acids.

6. The soldering flux of claim 3, wherein the carboxylic acid fluxing agents are a plurality of $C_2$–$C_{10}$ dicarboxylic acids.

7. The soldering flux of claim 4, wherein the carboxylic acid fluxing agents are a plurality of $C_2$–$C_{10}$ dicarboxylic acids.

8. The soldering flux of claim 2, wherein the carboxylic acid fluxing agents are a plurality of $C_2$–$C_{10}$ dicarboxylic acids.

9. A soldering process, characterized by applying on the surfaces intended for soldering, prior to the soldering, a soldering flux according to claim 1 and preheating said surfaces to vaporize the deionized water solvent, followed by heating to the temperature required for soldering.

10. The process of claim 9 wherein the soldering surfaces are soldering surfaces of silver, copper, tin, or alloys thereof.

11. The process of claim 9 wherein the soldering surface is copper or an alloy of copper on a circuit board.

* * * * *